US010715942B2

(12) United States Patent
Wang et al.

(10) Patent No.: US 10,715,942 B2
(45) Date of Patent: Jul. 14, 2020

(54) MICROPHONE AND MANUFACTURE THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Mingjun Wang, Shanghai (CN); Xinxue Wang, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

(*) Notice: Subject to any disclaimer, the term of this patent is extended or adjusted under 35 U.S.C. 154(b) by 127 days.

(21) Appl. No.: 16/018,870

(22) Filed: Jun. 26, 2018

(65) Prior Publication Data

US 2018/0376270 A1 Dec. 27, 2018

(30) Foreign Application Priority Data

Jun. 27, 2017 (CN) .......................... 2017 1 0511741

(51) Int. Cl.

| | |
|---|---|
| ***H01L 23/48*** | (2006.01) |
| ***H04R 31/00*** | (2006.01) |
| *H04R 19/04* | (2006.01) |
| *H04R 19/00* | (2006.01) |

(52) U.S. Cl.
CPC ........... *H04R 31/00* (2013.01); *H04R 19/005* (2013.01); *H04R 19/04* (2013.01); *H04R 2201/003* (2013.01); *H04R 2231/001* (2013.01)

(58) Field of Classification Search
CPC ......... H01L 41/22; H01L 41/23; H01L 41/25; H01L 41/253; H01L 41/27; H01L 41/277; H01L 41/332
See application file for complete search history.

(56) References Cited

U.S. PATENT DOCUMENTS

| | | | | |
|---|---|---|---|---|
| 6,573,154 | B1 * | 6/2003 | Sridhar | B81C 1/00619 438/404 |
| 2014/0264651 | A1 * | 9/2014 | Dehe | B81C 1/00984 257/416 |
| 2017/0250112 | A1 * | 8/2017 | Barzen | H01L 21/76898 |

FOREIGN PATENT DOCUMENTS

| | | |
|---|---|---|
| CN | 201571176 U | 9/2010 |

* cited by examiner

*Primary Examiner* — Cuong Q Nguyen
(74) *Attorney, Agent, or Firm* — Innovation Counsel LLP

(57) ABSTRACT

A microphone and its manufacturing method are presented. The manufacturing method includes providing a substrate; forming a ring opening extending from an upper surface of the substrate into the substrate; forming a ring separation component by forming a separation material in the ring opening; forming an insulation layer on the substrate; forming a front-end device on the insulation layer; and etching a back side of the substrate using the ring separation component and the insulation layer as an etch-stop layer to form a back-hole.

18 Claims, 10 Drawing Sheets

MICROPHONE AND MANUFACTURE THEREOF

CROSS-REFERENCE TO RELATED APPLICATION

This application claims priority to and benefit of Chinese Patent Application No. 201710511741.X filed on Jun. 27, 2017, which is incorporated herein by reference in its entirety.

BACKGROUND

(a) Field of the Invention

This inventive concept relates to semiconductor technology and, more specifically, to a microphone and its manufacturing method.

(b) Description of the Related Art

Conventional MicroElectroMechanical Systems (MEMS) microphones typically comprise a substrate, a back-hole going through the substrate, and a front-end device on the substrate covering the back-hole. The contour of the back-hole directly affects the performance of the microphone, therefore forming a proper back-hole is a critical procedure in a manufacturing process.

Conventional methods to form a back-hole have several limitations. First, the back-holes formed on the center of a wafer have different contours at a corner near a vibration film than the back-holes at the boundary of a wafer. The former usually has a smooth surface at the corner near the vibration film, so that the vibration film could make a line contact with the substrate when vibrating. The latter, however, has a rougher surface at the corner near the vibration film due to the widespread notches in those regions. As a result, the vibration film at the boundary of a wafer will make point contact with the substrate when vibration happens, and thus become more susceptible to damage than its counterparts at the center of a wafer.

Second, the sidewalls of the back-holes formed on the boundary of a wafer usually have a larger tilt angle than their counterparts on the center of a wafer. A large tilt angle may shrink the overlap region between the vibration film and the substrate, in some cases, to a degree that can severely deteriorate the performance (e.g., signal-to-noise ratio) of the microphone.

SUMMARY

Being aware of various limitations of conventional microphone manufacturing methods, this inventive concept remedies at least some of those limitations.

This inventive concept first presents a microphone manufacturing method, comprising: providing a substrate;

forming a ring opening extending from an upper surface of the substrate into the substrate;

forming a ring separation component by forming a separation material in the ring opening;

forming an insulation layer on the substrate;

forming a front-end device on the insulation layer; and etching a back side of the substrate using the ring separation component and the insulation layer as an etch-stop layer to form a back-hole.

Additionally, in the aforementioned method the separation material may be formed in the ring opening through a thermal oxidation process, the thermal oxidation process may oxidize the upper surface of the substrate to form an oxidation layer, and the back-hole may be formed by etching the back side of the substrate using the ring separation component, the oxidation layer, and the insulation layer as an etch-stop layer.

Additionally, in the aforementioned method, etching a back side of the substrate using the ring separation component and the insulation layer as an etch-stop layer to form a back-hole may comprise:

(a) flipping the substrate so that the back side of the substrate faces upward;

(b) etching the back side of the substrate to form a first groove;

(c) forming a polymer on the bottom and the sidewall of the first groove;

(d) removing the polymer on the bottom of the first groove to expose a portion of the substrate;

(e) isotropically etching the exposed portion of the substrate to form a second groove, if the isotropic etching reaches the insulation layer or the ring separation component, stop the process, otherwise go to step (f); and (f) substituting the first groove in steps (c) and (d) with the second groove in step (e) and repeating step (c) and its succeeding steps.

Additionally, in the aforementioned method, the isotropic etchings on the exposed portion of the substrate in all the repetition of step (e) may have the same etching rate.

Additionally, in the aforementioned method, a sectional view of the ring opening on a plane parallel with the upper surface of the substrate may have a shape of a circular ring or a square ring, and the front-end device may comprise:

a first electrode layer on the insulation layer;

a sacrificial layer on the first electrode layer; and a second electrode layer on the sacrificial layer.

Additionally, the aforementioned method may further comprise:

removing the ring separation component and at least a portion of the insulation layer; and removing the sacrificial layer to form a cavity between the first electrode layer and the second electrode layer.

Additionally, in the aforementioned method, a portion of the insulation layer facing the back-hole and a neighboring portion of the insulation layer on the substrate may be removed, while a portion of the insulation layer underneath the boundary of the first electrode layer may be retained.

This inventive concept further presents a microphone, comprising:

a substrate comprising a back-hole, wherein the back-hole comprises:

a first component; and a second component underneath the first component, wherein cross-sections of the first component on planes parallel with an upper surface of the substrate have substantially the same diameter, and cross-sections of the second component on planes parallel the upper surface of the substrate have monotonically decreasing diameters from top to bottom.

Additionally, the aforementioned microphone may further comprise:

a first electrode layer on the substrate covering the back-hole; and a second electrode layer on the first electrode layer, wherein there is a cavity between the first electrode layer and the second electrode layer.

Additionally, the aforementioned microphone may further comprise an insulation layer between the substrate and the first electrode layer.

This inventive concept further presents yet another microphone manufacturing method, comprising:

providing a substrate;

forming a ring opening extending from an upper surface of the substrate into the substrate;

forming a ring separation component by forming a separation material in the ring opening;

forming an oxidation layer on the substrate;

forming a front-end device on the oxidation layer; and etching a back side of the substrate using the ring separation component and the oxidation layer as an etch-stop layer to form a back-hole.

Additionally, in the aforementioned method, forming a front-end device on the oxidation layer may comprise:

forming an insulation layer on the oxidation layer; and forming a front-end device on the insulation layer, and wherein when etching the back side of the substrate to form the back-hole, the ring separation component, the oxidation layer, and the insulation layer are used as an etch-stop layer.

Additionally, in the aforementioned method, the separation material may be formed in the ring opening through a thermal oxidation process, and the thermal oxidation process may form the oxidation layer on the upper surface of the substrate.

Additionally, in the aforementioned method, etching a back side of the substrate using the ring separation component and the oxidation layer as an etch-stop layer to form a back-hole may comprise:

(a) flipping the substrate so that the back side of the substrate faces upward;

(b) etching the back side of the substrate to form a first groove;

(c) forming a polymer on the bottom and the sidewall of the first groove;

(d) removing the polymer on the bottom of the first groove to expose a portion of the substrate;

(e) isotropically etching the exposed portion of the substrate to form a second groove, if the isotropic etching reaches the oxidation layer or the ring separation component, stop the process, otherwise go to step (f); and (f) substituting the first groove in steps (c) and (d) with the second groove in step (e) and repeating step (c) and its succeeding steps.

Additionally, in the aforementioned method, the isotropic etchings on the exposed portion of the substrate in all the repetition of step (e) may have the same etching rate.

Additionally, in the aforementioned method, a sectional view of the ring opening on a plane parallel with the upper surface of the substrate may have a shape of a circular ring or a square ring, and the front-end device may comprise:

a first electrode layer on the oxidation layer;

a sacrificial layer on the first electrode layer; and a second electrode layer on the sacrificial layer.

Additionally, the aforementioned method may further comprise:

removing the ring separation component and at least a portion of the oxidation layer; and removing the sacrificial layer to form a cavity between the first electrode layer and the second electrode layer.

Additionally, in the aforementioned method, a portion of the oxidation layer facing the back-hole and a neighboring portion of the oxidation layer on the substrate may be removed, while a portion of the oxidation layer underneath the boundary of the first electrode layer may be retained.

BRIEF DESCRIPTION OF THE DRAWINGS

The drawings illustrate some embodiments of this inventive concept and will be used to describe this inventive concept along with the specification.

DETAILED DESCRIPTION OF THE EMBODIMENTS

Figure 1:
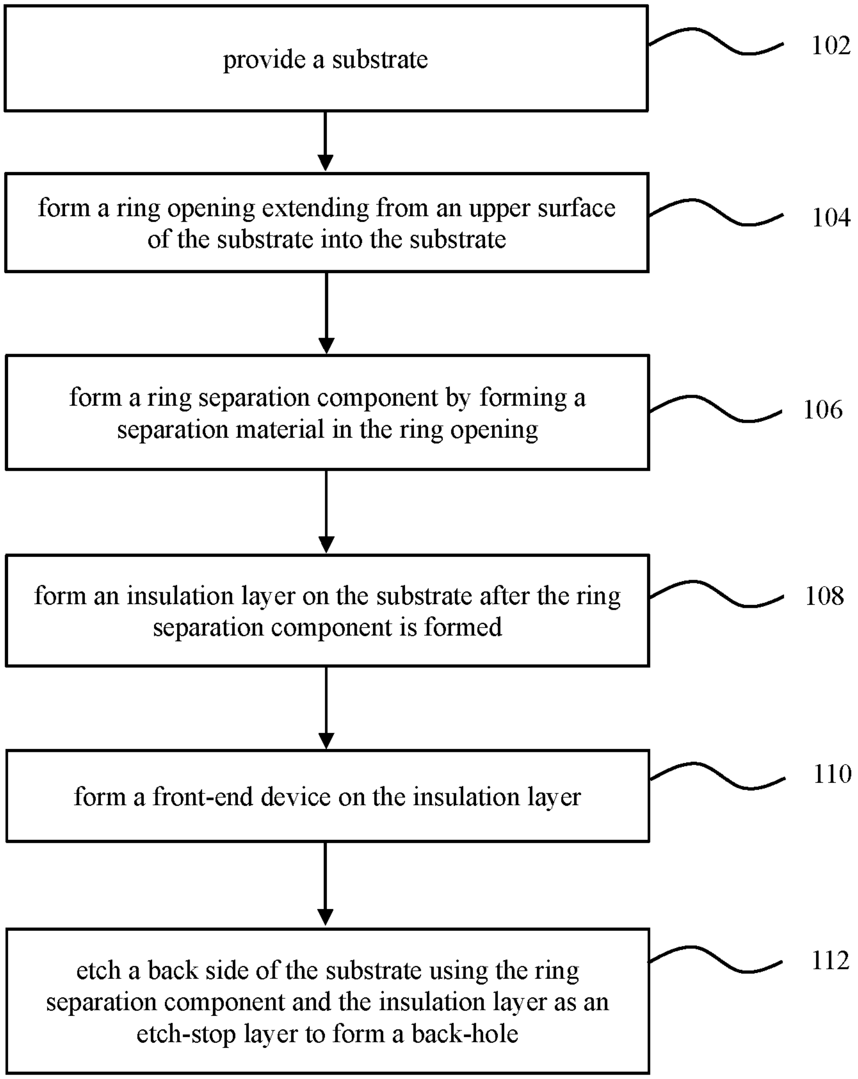
FIG. 1 shows a flowchart illustrating a microphone manufacturing method in accordance with one embodiment of the inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms “first,” “second,” etc. may be used herein to describe various elements, these elements shall not be limited by these terms. These terms may be used to distinguish one element from another element. Thus, a first element discussed below may be termed a second element without departing from the teachings of the present inventive concept. The description of an element as a “first” element may not require or imply the presence of a second element or other elements. The terms “first,” “second,” etc. may also be used herein to differentiate different categories or sets of elements. For conciseness, the terms “first,” “second,” etc. may represent “first-category (or first-set),” “second-category (or second-set),” etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a flowchart illustrating a microphone manufacturing method in accordance with one embodiment of the inventive concept. FIGS. 2A, 2B, 2C, 2D, 2E, 2F, 2G and 2H show schematic sectional views illustrating different stages of this microphone manufacturing method. This microphone manufacturing method is described below with reference to these drawings.

Figure 2A:
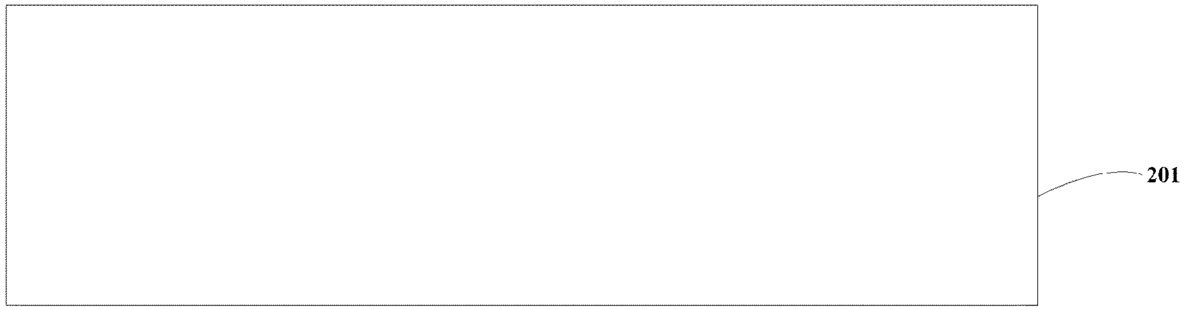
FIGS. 2A, 2B, 2C, 2D, 2E, 2F, 2G and 2H show schematic sectional views illustrating different stages of a microphone manufacturing method in accordance with one embodiment of this inventive concept.

Referring to FIG. 1, in step 102, a substrate 201 is provided, as shown in FIG. 2A. The substrate 201 may be a semiconductor substrate such as a silicon substrate or a germanium substrate, it may also be a semiconductor compound substrate such as a gallium arsenide (GaAs) substrate. The thickness of the substrate 201 may be about 725 μm.

Figure 2B:
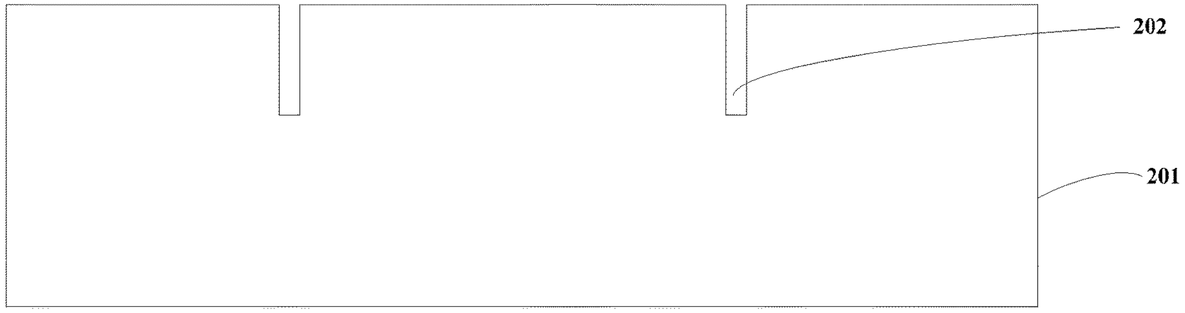

Next, in step 104, a ring opening 202 extending from an upper surface of the substrate 201 into the substrate 201 is formed, as shown in FIG. 2B.

In one embodiment, a patterned hard mask layer, which may comprise silicon nitride, silicon oxide, or silicon oxynitride, may first be formed on the substrate 201, then the ring opening 202 may be formed by etching the substrate 201 using the hard mask layer as a mask. The depth and width of the ring opening 202 may be set according to the manufacture requirements. For example, the ring opening 202 may have a depth of 30 μm and a width of 1 μm.

In one embodiment, a sectional view of the ring opening 202 on a plane parallel with an upper surface of the substrate 201 may have a shape of a circular ring or a square ring. The shape of the sectional view of the ring opening 202 is not limited herein, and it may be other enclosed shapes as well.

Figure 2C:
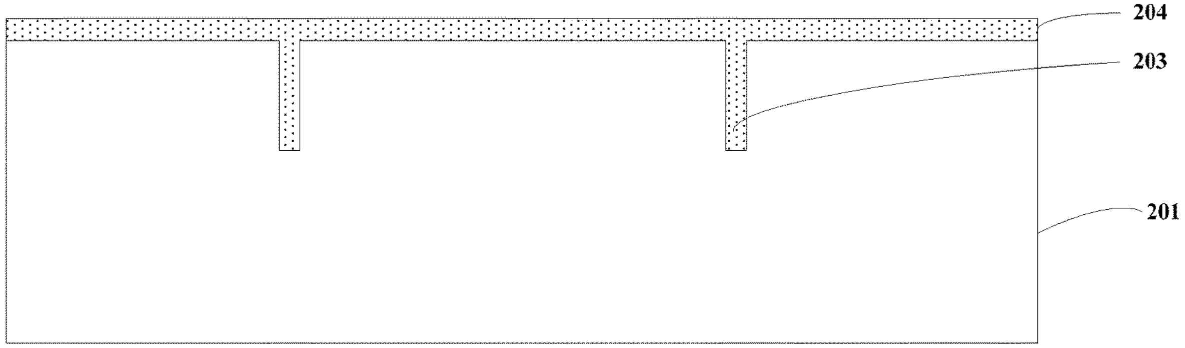

Next, in step 106, a ring separation component 203 is formed by forming a separation material in the ring opening 202, as shown in FIG. 2C.

The separation material may be formed in the ring opening 202 through a thermal oxidation process. In one embodiment, the thermal oxidation process may also oxidize the upper surface of the substrate 201 to form an oxidation layer 204. The oxidation layer 204 may be removed immediately after it is formed by an additional removal procedure, or it can be removed later. In other embodiments, the separation component 203 may be formed by depositing the separation material in the ring opening 202.

Figure 2D:
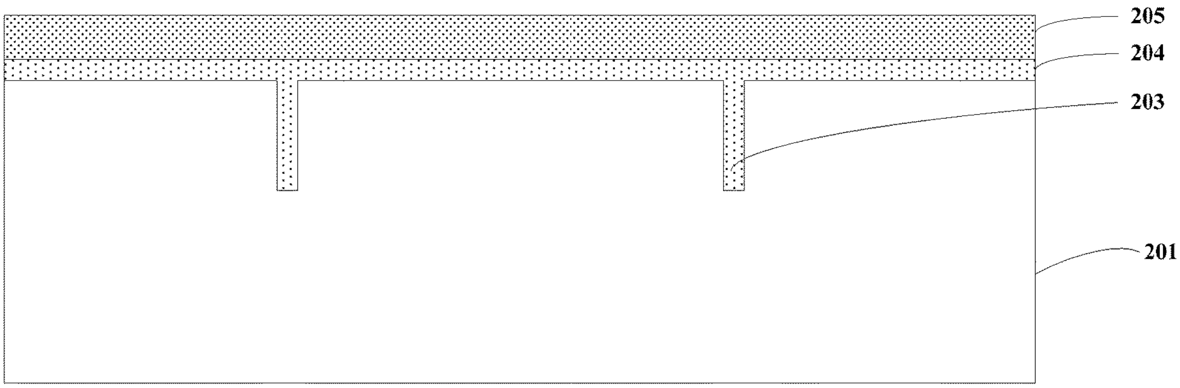

Next, in step 108, after the separation component 203 is formed, an insulation layer 205 is formed on the substrate 201, as shown in FIG. 2D. The insulation layer 205 may work as an etch-stop layer in a succeeding etching process that forms a back-hole.

The insulation layer 205 may comprise silicon nitride, silicon oxide, or silicon oxynitride, and may have a thickness in a range of 1.5 μm to 2.5 μm (e.g., around 2 μm).

It should be understood that if the oxidation layer 204 formed by the thermal oxidation process is not removed at this time, the insulation layer 205 will be formed on the oxidation layer 204, and the insulation layer 205 and the oxidation layer 204 together may work as an etch-stop layer in a succeeding etching process that forms a back-hole.

Figure 2E:
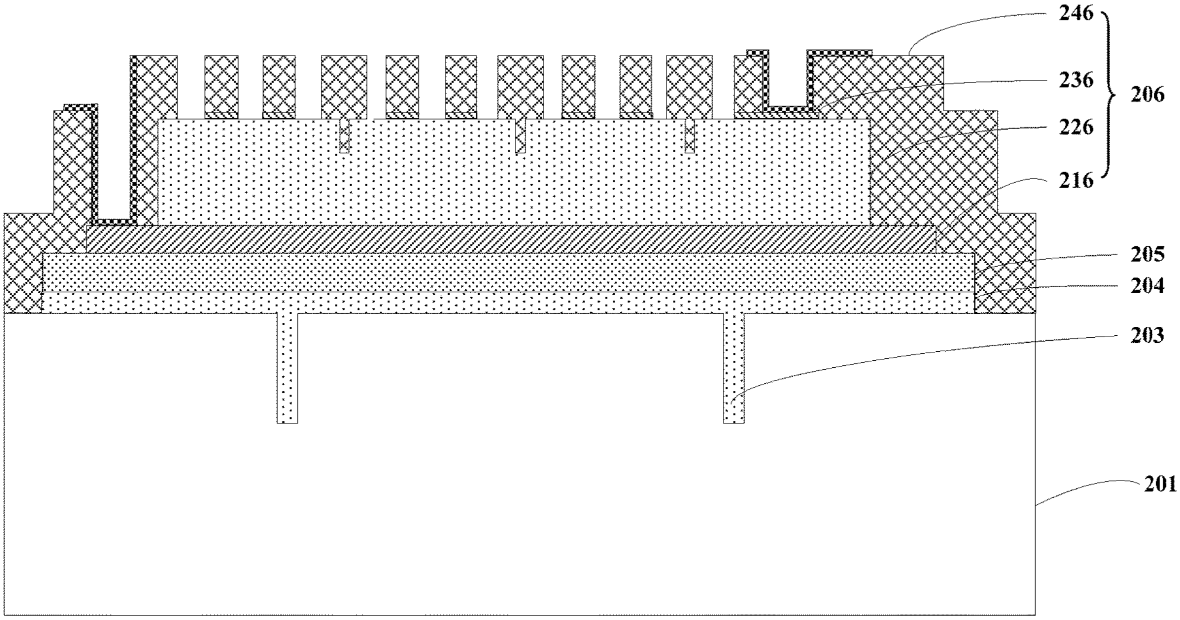

Next, in step 110, a front-end device 206 is formed on the insulation layer 205, as shown in FIG. 2E. In one embodiment, the front-end device 206 may comprise a first electrode layer 216 (i.e., a vibration film) on the insulation layer 205, a sacrificial layer 226 on the first electrode layer 216, and a second electrode layer 236 on the sacrificial layer 226. In one embodiment, the front-end device 206 may further comprise a support layer 246 on the second electrode layer 236. The support layer 246 may comprise a block component that prevents the first electrode layer 216 and the second electrode layer 236 from contacting each other.

The first electrode layer 216 and the second electrode layer 236 may be made of poly-silicon, the sacrificial layer 226 may be made of silicon oxide, and the support layer 246 may be made of silicon nitride.

It should be understood that FIG. 2E only displays some major components of the front-end device 206, and the front-end device 206 may further comprise, although not shown in FIG. 2E, other components such as contact components for the first electrode layer 216 and the second electrode layer 236.

Figure 2F:
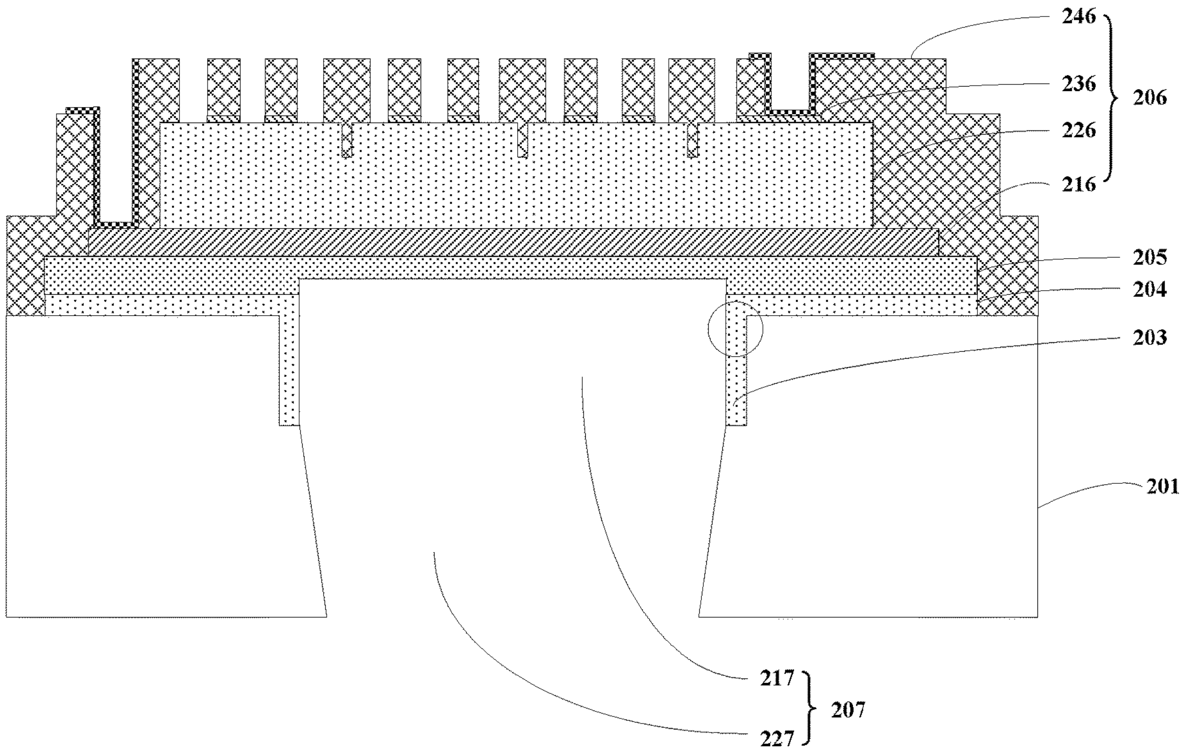

Next, in step 112, a back side of the substrate 201 is etched using the ring separation component 203 and the insulation layer 205 as an etch-stop layer to form a back-hole 207 that goes through the substrate 201, as shown in FIG. 2F. The depth of the back-hole 207 may be about 400 μm.

If the oxidation layer 204 on the substrate 201 has not been removed at this time, then the oxidation layer 204, the ring separation component 203, and the insulation layer 205 may together work as an etch-stop layer when the back side of the substrate 201 is etched. In that case, the etching on the back side of the substrate 201 may stop either in the oxidation layer 204 or in the insulation layer 205.

During the etching on the back side of the substrate 201, the ring separation component 203 works as an etch-stop layer that prevents excessive lateral etching on the substrate 201. That is, a corner of the back-hole 207 near the first electrode layer 216 (circled in FIG. 2F) will not be excessively etched to form notches. As a result, the corner of the back-hole 207 will have a smooth surface, which makes the first electrode layer 216 less susceptible to damage.

Due to the etch-stop effect of the ring separation component 203, the tilt angle of the sidewall of the back-hole 207 will remain substantially the same across multiple runs of this microphone manufacturing method. Thus, the overlap region between the first electrode layer 216 and the substrate 201 will also remain substantially the same. Therefore this method remedies a limitation of conventional methods that the overlapped region between the first electrode layer 216 and the substrate 201 may vary due to the variation in the tilt angles of the sidewall of the back-hole 207.

Additionally, since the overlap region is determined by the sizes and positions of the first electrode layer 216 and the ring separation component 203, these parameters can be pre-selected to improve the consistency of the overlapped region, and thus the performance of the microphone.

Referring to FIG. 2F, the back-hole 207 may comprise a first component 217 and a second component 227 underneath the first component 217. The cross-sections of the first component 217 on planes parallel with the upper surface of the substrate 201 may have substantially the same diameter, that is, the first component 217 may have substantially same sectional views on planes parallel with the upper surface of the substrate 201 throughout its entire body. The cross-sections of the second component 227 on planes parallel with the upper surface of the substrate 201 may have monotonically decreasing diameters from top to bottom, that is, the second component 227 may have sectional views monotonically decreased in size from top to bottom on planes parallel with the upper surface of the substrate 201. The opening of the back-hole 207 on a bottom surface of the substrate 201 may have the smallest diameter, as shown in FIG. 2F. In this application, the diameters of the back-hole 207 in two different locations are considered "substantially the same" if the difference between these two diameters are within a normal process variation.

Figure 2G:
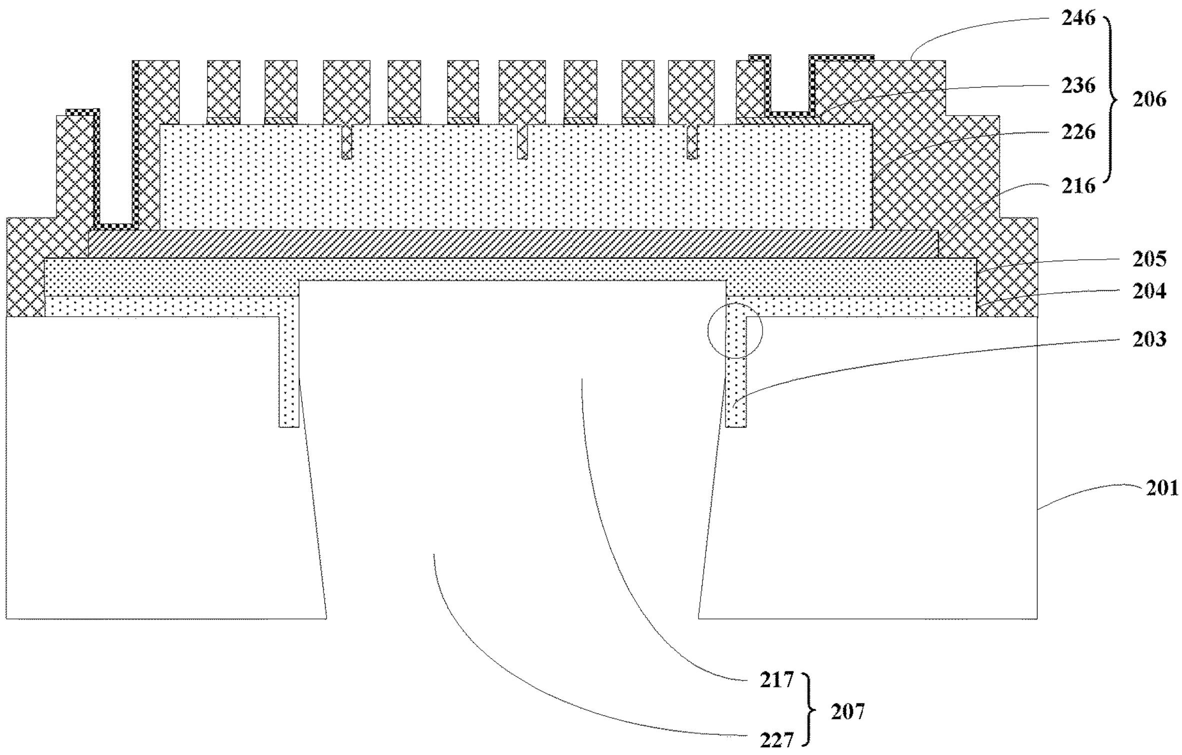

Although FIG. 2F shows a second component 227 of the back-hole 207 extending from the lower end of ring separation component 203 to the bottom surface of the substrate 201, the position of the second component 227 in this inventive concept is not limited herein. For example, in one embodiment, the second component 227 of the back-hole 207 may extend from the middle of the ring separation component 203 to the bottom surface of the substrate 201, as shown in FIG. 2G.

Figure 2H:
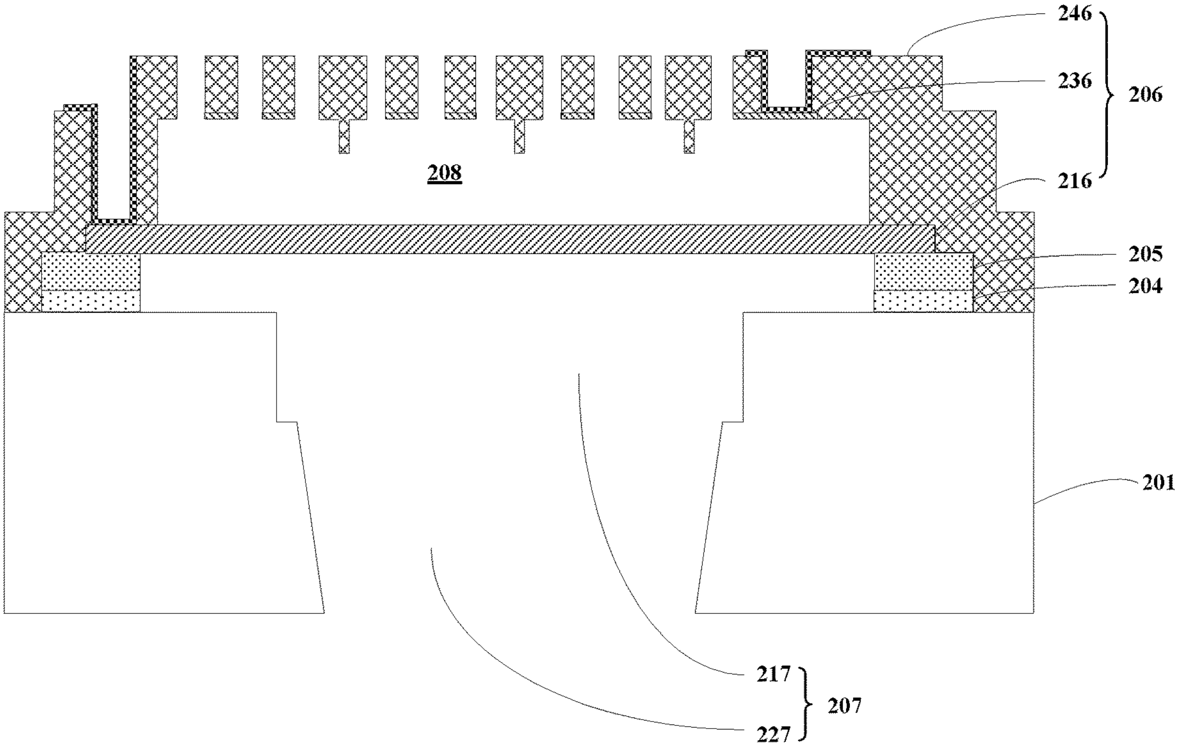

After the back-hole 207 is formed, the ring separation component 203 and at least a portion of the insulation layer 205 may be removed. In one embodiment, the entire insulation layer 205 may be removed. In another embodiment, only a portion of the insulation layer 205 facing the back-hole 207 and a neighboring portion of the insulation layer 205 on the substrate 201 are removed, while a portion of the insulation layer 205 underneath the boundary of the first electrode layer 216 is retained, as shown in FIG. 2H.

Additionally, if there exists the oxidation layer 204 on the substrate 201, at least a portion of the oxidation layer 204 may also be removed. The sacrificial layer 226 may also be removed to form a cavity between the first electrode layer 216 and the second electrode layer 236.

FIGS. 3A, 3B, 3C, 3D, 3E, and 3F show schematic sectional views illustrating different stages of a process to etch a back side of a substrate to form a back-hole in accordance with one embodiment of the inventive concept. This process is described below with reference to these drawings. It should be understood that, to better illustrate the process that forms the back-hole 207, FIGS. 3A, 3B, 3C, 3D, 3E, and 3F only display the components that are related to this process, such as the substrate 201, the ring separation component 203 and the insulation layer 205, components that are not involved in this process, such as the front-end device 206, are omitted in these drawings for conciseness purpose.

Figure 3A:
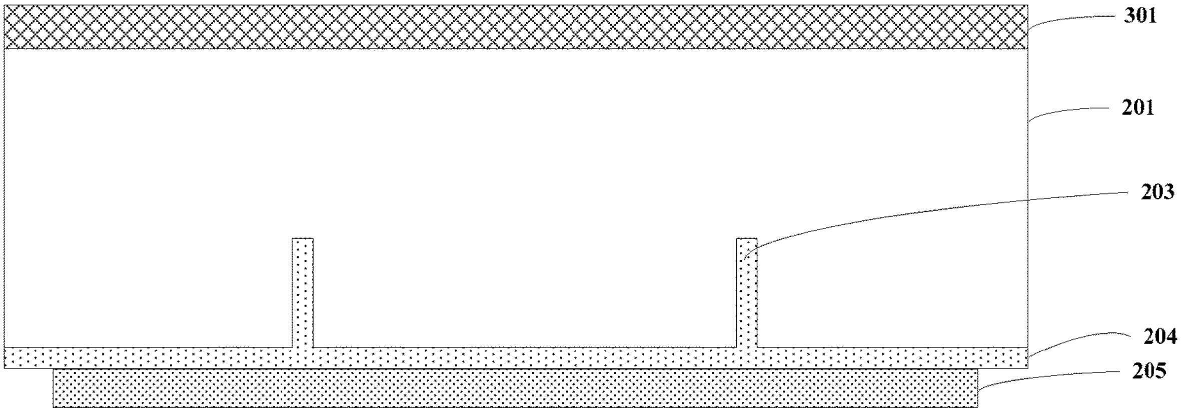
FIGS. 3A, 3B, 3C, 3D, 3E, and 3F show schematic sectional views illustrating different stages of a process to etch a back side of a substrate to form a back-hole in accordance with one embodiment of the inventive concept.

First, referring to FIG. 3A, the substrate 201 is flipped upside down, so that a back side of the substrate 201 faces upward. There may be a back oxidation layer 301 on the back side of the substrate 201.

Figure 3B:
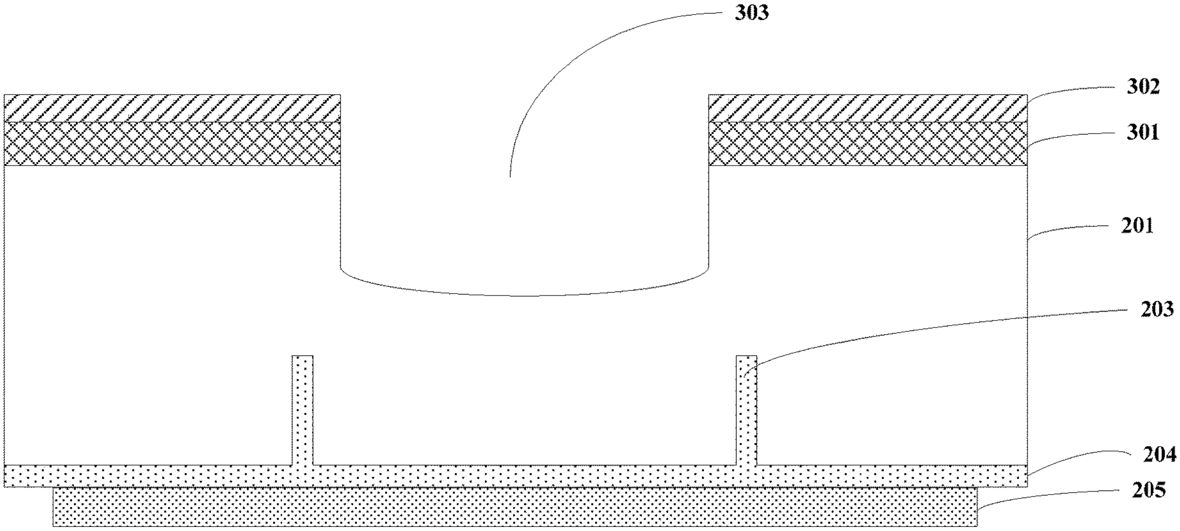

Next, referring to FIG. 3B, a groove 303 is formed by etching the back side of the substrate 201. In this step, a patterned hard mask layer 302 (e.g., a photoresist) may first be formed on the back oxidation layer 301 to define the position and size of a first groove 303, the hard mask layer 302 also defines the position and size of the back-hole 307 at the back side of the substrate 201. Then, the back side of the substrate 201 is etched (e.g., by fluorine ion plasma etching) using the hard mask layer 302 as a mask to form the first groove 303.

Figure 3C:
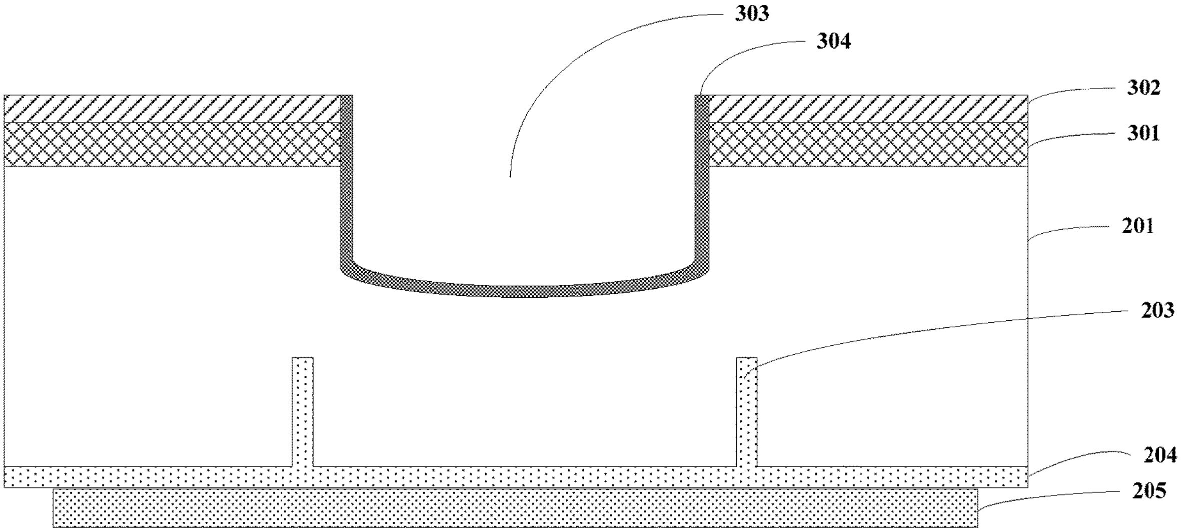

Next, referring to FIG. 3C, a polymer 304 (e.g., polyfluorocarbons $(CF_x)_n$) may be formed on the bottom and the sidewall of the first groove 303).

Figure 3D:
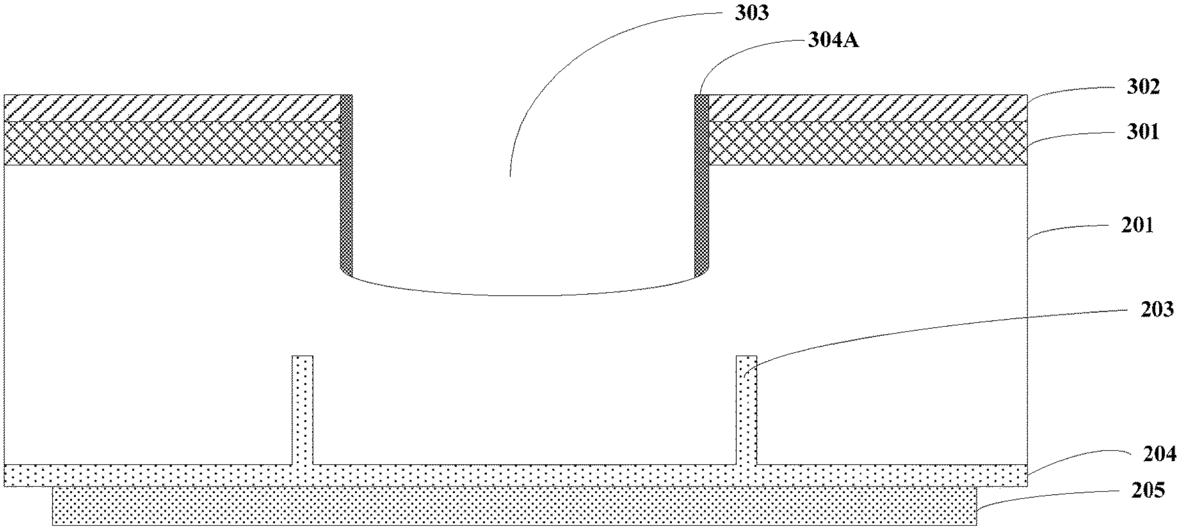

Next, referring to FIG. 3D, the polymer 304 on the bottom of the first groove 303 is removed to expose a portion of the substrate 201. The polymer 304 on the bottom of the first groove 303 may be removed by sulfur fluoride ion ($SF_x^+$) plasma etching.

Figure 3E:
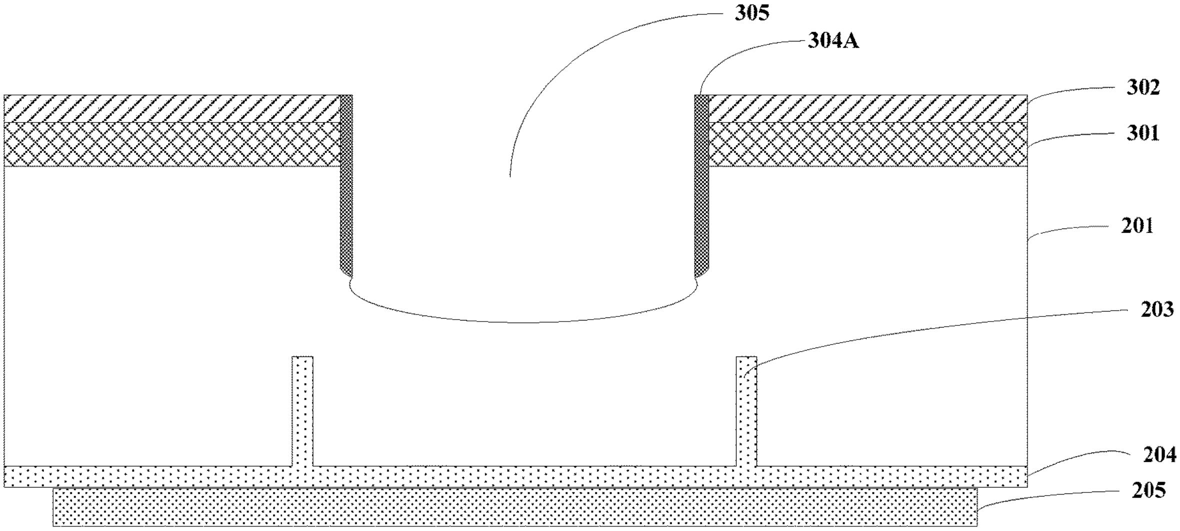

Next, referring to FIG. 3E, the exposed portion of the substrate 201 is isotropically etched to form a second groove 305. In this step, the polymer 304A on the sidewall of the first groove 303 can work as a protection layer and protect the substrate 201 behind it from being etched.

Figure 3F:
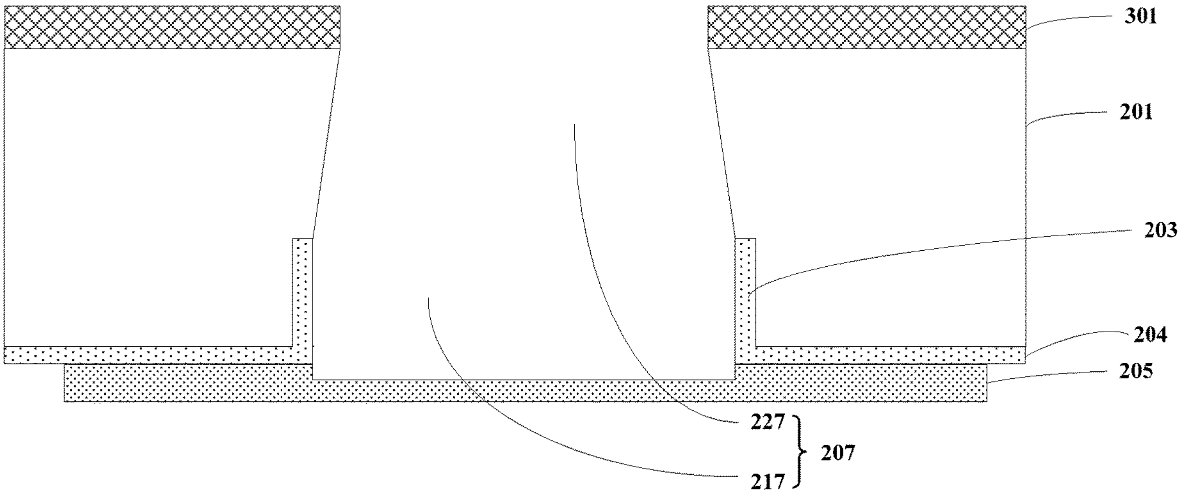

Next, the steps illustrated in FIGS. 3C, 3D, and 3E are repeated on the second groove 305 until the isotropic etching reaching either the insulation layer 205 or the ring separation component 203. After that, the hard mask layer 302 and the remaining polymer 304A may be removed, as shown in FIG. 3F.

In one embodiment, when repeating the steps illustrated in FIGS. 3C, 3D, and 3E, the isotropic etchings on the exposed portion of the substrate 201 may have the same etching rate.

In conventional manufacturing methods, when repeating the steps illustrated in FIGS. 3C, 3D, and 3E, the isotropic etching on the substrate 201 typically has a relatively high etching rate in the first several runs, and the etching rate need to be lowered when the etching is about to reach the insulation layer 205 in order to reduce the size of scallops that will be formed on the sidewall of the back-hole 207. Although reduced etching rate may extenuate the number and size of notches formed on the corners of the back-hole 207 near the first electrode layer 216, it does not completely eliminate the problem. Without the ring separation component 203 in the substrate 201, the etching rate to the exposed portion of the substrate 201 at the boundary of a wafer is larger than that at the center, this discrepancy can still result in notches formed on the corner of the back-hole 207 near the first electrode layer 216, which in turn renders the first electrode layer 216 susceptible to damage. Additionally, lowering the etching rate may lower the yield (in terms of wafer-per-hour (WFH)) and prolong the manufacturing time.

In the manufacturing method in this inventive concept, a ring separation component 203 is formed in the substrate 201, which prevents the corner of the back-hole 207 near the first electrode layer 216 from being excessively etched and generating notches. Hence, when repeating the step illustrated in FIGS. 3C, 3D, and 3E, the etching rate to the exposed portion of the substrate 201 may remain a constant, which resulted in higher WFH and less manufacture time compared to conventional manufacturing methods. In one embodiment, the WFH may be increased by 10% by adopting the manufacturing method of this inventive concept.

Figure 4:
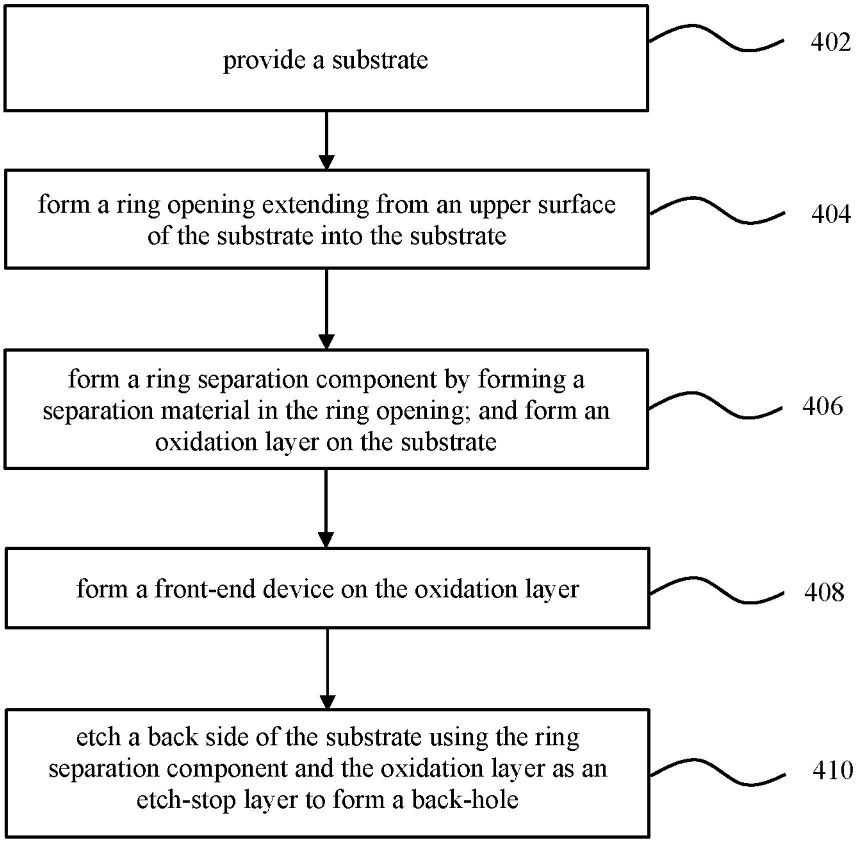
FIG. 4 shows a flowchart illustrating a microphone manufacturing method in accordance with another embodiment of the inventive concept.

FIG. 4 shows a flowchart illustrating a microphone manufacturing method in accordance with another embodiment of the inventive concept.

Referring to FIG. 4, in step 402, a substrate (e.g., a silicon substrate) is first provided.

In step 404, a ring opening extending from an upper surface of the substrate into the substrate is formed, a sectional view of the ring opening on a plane parallel with the upper surface of the substrate may be a circular ring, a square ring, or other enclosed shapes.

In step 406, a ring separation component is formed by forming a separation material in the ring opening, and an oxidation layer is formed on the substrate. In one embodiment, the separation material and the oxidation layer may be formed through a thermal oxidation process.

In step 408, a front-end device is formed on the oxidation layer. The front-end device may have the same composition as that described above (e.g., comprising a first electrode layer, a sacrificial layer, and a second electrode layer, etc.). Compared to the embodiment shown in FIG. 1, the first electrode layer in this embodiment is formed on the oxidation layer, not on the insulation layer.

In step 410, a back side of the substrate is etched using the ring separation component and the oxidation layer as an etch-stop layer to form a back-hole.

Compared with the embodiment shown in FIG. 1, the embodiment shown in FIG. 4 comprises an oxidation layer but not an insulation layer. In this embodiment, a ring separation component is formed in the substrate and an oxidation layer is formed on the substrate, therefore when etching the back side of the substrate to form the back-hole, the ring separation component and the oxidation layer may be used as an etch-stop layer. This embodiment can achieve similar benefit with that shown in FIG. 1.

In one embodiment, if the oxidation layer is not thick enough to be an etch-stop layer, an insulation layer may be formed on the oxidation layer and, in this case, the front-end device is formed on the insulation layer, and when etching the back side of the substrate to form the back-hole, the ring separation component, the oxidation layer, and the insulation layer together work as an etch-stop layer.

Referring to FIG. 2H, after the back-hole is formed, the ring separation component 203 and at least a portion of the oxidation layer 204 may be removed. In one embodiment, the entire oxidation layer 204 may be removed. In another embodiment, only a portion of the oxidation layer 204 facing the back-hole 207 and a neighboring portion of the oxidation layer 204 on the substrate 201 are removed, while a portion of the oxidation layer 204 underneath the boundary of the first electrode layer 216 is retained, as shown in FIG. 2H.

Additionally, the sacrificial layer 226 may also be removed to form a cavity 208 between the first electrode layer 216 and the second electrode layer 236.

The manufacturing method described in FIG. 4 is similar to that described in FIG. 1, except that when etching the back side of the substrate to form a back-hole 207, the method in FIG. 4 uses the ring separation component 203 and the oxidation layer 204 as an etch-stop layer, while the method in FIG. 1 uses the ring separation component 203 and the insulation layer 205 as an etch-stop layer.

This inventive concept further presents a microphone. As shown in FIG. 2H, the microphone may comprise a substrate 201 comprising a back-hole 207. The back-hole 207 may comprise a first component 217 and a second component 227 underneath the first component 217. The first component 217 has walls that are substantially perpendicular to the surface of the substrate 216, such that its diameter remains substantially constant. In contrast, the second component 227 has slanted sidewalls that form an angle with respect to the surface of the substrate 216. The diameter of the second component 227 may decrease from top to bottom.

In one embodiment, the microphone may further comprise a first electrode layer 216 on the substrate 201 covering the back-hole 207, and a second electrode layer 236 on the first electrode layer 216, there exists a cavity 208 between the first electrode layer 216 and the second electrode layer 236.

In one embodiment, the microphone may further comprise an insulation layer 205 between the substrate 201 and the first electrode layer 216, and an oxidation layer 204 between the substrate 201 and the insulation layer 205.

This concludes the description of a microphone and its manufacturing method in accordance with one or more embodiments of this inventive concept. For the purpose of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A microphone manufacturing method, comprising:
providing a substrate;
forming a ring opening extending from an upper surface of the substrate into the substrate;
forming a ring separation component by forming a separation material in the ring opening;
forming an insulation layer on the substrate;
forming a front-end device on the insulation layer; and
etching a back side of the substrate using the ring separation component and the insulation layer as an etch-stop layer to form a back-hole, wherein the back-hole has decreasing diameters from a bottom of the ring opening to the back side of the substrate.

2. The method of claim 1, wherein the separation material is formed in the ring opening through a thermal oxidation process.

3. The method of claim 2, wherein the thermal oxidation process oxidizes the upper surface of the substrate to form an oxidation layer, and wherein the back-hole is formed by etching the back side of the substrate using the ring separation component, the oxidation layer, and the insulation layer as an etch-stop layer.

4. The method of claim 1, wherein etching a back side of the substrate using the ring separation component and the insulation layer as an etch-stop layer to form a back-hole comprises: (a) flipping the substrate so that the back side of the substrate faces upward; (b) etching the back side of the substrate to form a first groove; (c) forming a polymer on the bottom and the sidewall of the first groove; (d) removing the polymer on the bottom of the first groove to expose a portion of the substrate; (e) isotropically etching the exposed portion of the substrate to form a second groove, if the isotropic etching reaches the insulation layer or the ring separation component, stop the process, otherwise go to step (f); and (f) substituting the first groove in steps (c) and (d) with the second groove in step (e) and repeating step (c) and its succeeding steps.

5. The method of claim 4, wherein the isotropic etchings on the exposed portion of the substrate in all the repetition of step (e) have the same etching rate.

6. The method of claim 1, wherein the insulation layer directly contacts the ring separation component, and wherein a material of the insulation layer is different from a material of the ring separation component.

7. The method of claim 1, wherein the front-end device comprises: a first electrode layer on the insulation layer; a sacrificial layer on the first electrode layer; and a second electrode layer on the sacrificial layer.

8. The method of claim 7, further comprising: removing the ring separation component and at least a portion of the insulation layer; and removing the sacrificial layer to form a cavity between the first electrode layer and the second electrode layer.

9. The method of claim 8, wherein a portion of the insulation layer facing the back-hole and a neighboring portion of the insulation layer on the substrate are removed, while a portion of the insulation layer underneath a boundary of the first electrode layer is retained.

10. A microphone manufacturing method, comprising:
providing a substrate;
forming a ring opening extending from an upper surface of the substrate into the substrate;
forming a ring separation component by forming a separation material in the ring opening;
forming an oxidation layer directly on the upper surface of the substrate, wherein the upper surface of the substrate is a semiconductor surface;
forming an insulation layer directly on the oxidation layer, wherein the insulation layer is completed separated from the substrate by the oxidation layer;
forming a front-end device directly on the insulation layer; and
etching a back side of the substrate using the ring separation component, the oxidation layer, and the insulation layer as an etch-stop layer to form a back-hole.

11. The method of claim 10,
wherein when etching the back side of the substrate to form the back-hole, a portion of the oxidation surrounded by the ring separation component and directly contacting the ring separation component is completely removed, and a portion of the oxidation layer surrounding the ring separation component is retained.

12. The method of claim 10, wherein the separation material is formed in the ring opening through a thermal oxidation process, and the thermal oxidation process forms the oxidation layer on the upper surface of the substrate.

13. The method of claim 10, wherein etching a back side of the substrate using the ring separation component and the oxidation layer as an etch-stop layer to form a back-hole comprises: (a) flipping the substrate so that the back side of the substrate faces upward; (b) etching the back side of the substrate to form a first groove; (c) forming a polymer on the bottom and the sidewall of the first groove; (d) removing the polymer on the bottom of the first groove to expose a portion of the substrate; (e) isotropically etching the exposed portion of the substrate to form a second groove, if the isotropic etching reaches the oxidation layer or the ring separation component, stop the process, otherwise go to step (f); and (f) substituting the first groove in steps (c) and (d) with the second groove in step (e) and repeating step (c) and its succeeding steps.

14. The method of claim 13, wherein the isotropic etchings on the exposed portion of the substrate in all the repetition of step (e) have the same etching rate.

15. The method of claim 10, wherein a sectional view of the ring opening on a plane parallel with the upper surface of the substrate has a shape of a circular ring or a square ring.

16. The method of claim 10, wherein the front-end device comprises: a first electrode layer on the oxidation layer; a sacrificial layer on the first electrode layer; and a second electrode layer on the sacrificial layer.

17. The method of claim 10, further comprising: removing the ring separation component and at least a portion of the oxidation layer; and removing the sacrificial layer to form a cavity between the first electrode layer and the second electrode layer.

18. The method of claim 17, wherein a portion of the oxidation layer facing the back-hole and a neighboring portion of the oxidation layer on the substrate are removed, while a portion of the oxidation layer underneath a boundary of the first electrode layer is retained.

* * * * *